United States Patent [19]

Mitomi

[11] Patent Number: 4,927,484
[45] Date of Patent: May 22, 1990

[54] REACTIVE ION ETCHING APPARTUS

[75] Inventor: Yoshimichi Mitomi, Wadasaki, Japan

[73] Assignee: Mitsubishi Denki Kabushiki Kaisha, Tokyo, Japan

[21] Appl. No.: 259,395

[22] Filed: Oct. 18, 1988

Related U.S. Application Data

[63] Continuation of Ser. No. 84,193, Aug. 12, 1987, abandoned.

[30] Foreign Application Priority Data

Sep. 3, 1986 [JP] Japan ................................ 61-205854

[51] Int. Cl.$^5$ ............................................. H01L 21/02
[52] U.S. Cl. ..................................... 156/345; 156/643; 118/50.1; 118/719; 118/730; 118/733
[58] Field of Search ................. 156/345, 643; 118/719, 118/730, 733, 50.1

[56] References Cited

U.S. PATENT DOCUMENTS

| | | | |
|---|---|---|---|
| 4,563,240 | 1/1986 | Shibata et al. | 156/643 |
| 4,687,542 | 8/1987 | Davis et al. | 156/643 |
| 4,693,777 | 9/1987 | Hazano et al. | 156/345 |

FOREIGN PATENT DOCUMENTS 60-115216 6/1985 Japan.
60-249328 12/1985 Japan ................................. 156/345

OTHER PUBLICATIONS

Hitachi's piece-by-piece treating type dry-etching apparatus "Model 206A type" advertisement.

Primary Examiner—David L. Lacey
Assistant Examiner—Lou Ann Johnson
Attorney, Agent, or Firm—Oblon, Spivak, McClelland, Maier & Neustadt

[57] ABSTRACT

A reactive ion etching apparatus includes first and second reactive chambers in a single buffer room. First and second stages are placed in front of corresponding reactive chambers. The centers of the reactive chambers and stages form a square. A first transfer arm transfers a wafer between the first reactive chamber and the first stage, a second transfer arm transfers the wafer among the first and second reactive chambers and the first and second stages, and a third transfer arm transfers the wafer between the second reactive chamber and the second stage. The second transfer arm is pivotably mounted at the center of the square and may turn a full 360°.

5 Claims, 2 Drawing Sheets

REACTIVE ION ETCHING APPARTUS

This application is a continuation of application Ser. No. 07/084,193 filed on Aug. 12, 1987, now abandoned.

BACKGROUND OF THE INVENTION

1. Field of the Invention

The present invention relates to a reactive ion etching apparatus with a wafer transferring mechanism which is used for manufacturing semiconductor devices.

2Discussion of Background

FIG. 2 shows a conventional reactive ion etching apparatus disclosed, for instance, in a catalogue of "R-206A model piece-by-piece treatment type dry-etching apparatus" manufactured by HITACHI LTD.

In FIG. 2, a wafer 1 is received in each cassette 2,3. An etching apparatus 100 and an after treatment apparatus 200 respectively contain reactive chambers 101 and 201. The etching apparatus 100 and the after treatment apparatus 200 have the same wafer-transferring mechanism although they have different structure of electrodes. The etching apparatus 100 is provided with a first load lock chamber 102 for introducing the wafer, a second load lock chamber 103 for drawing out the wafer, a wafer transferring belt 104, a lateral-transferring belt 105, a drawing-out belt 106, a stage 107, a pair of transfer arms 108, 109, gate shutters 110-112 for opening and closing passages of the wafer 1, a first reactive chamber 101 and a buffer room 113. The after treatment apparatus 200 is also provided with a first load lock chamber 202 for transferring the wafer, a second load lock chamber 203, a wafer transferring belt 204, a lateral-transferring belt 205, a drawing-out belt 206, a stage 207, a pair of transfer arms 208, 209 for transferring the wafer, gate shutters 210-211 for opening and closing the passages of the wafer 1, a second reactive chamber 201 and a buffer room 213.

In the conventional ion etching apparatus having the above-mentioned construction, operations for etching the wafer followed by an after treatment have been conducted as follows.

The wafer 1 is put in the cassette 2 and the pressure of the load lock chamber 102 is reduced to the same extent of a pressure in the buffer room 113. The gate shutter 110 is opened and the cassette 2 carrying the wafer 1 is forwarded into the buffer room 113 by means of the wafer transferring belt 104. Then, the cassette 2 is laterally moved to be put on the stage 107 by means of the lateral-feeding belt 105 which is perpendicular to the wafer transferring belt 104. The wafer 1 is subjected to posture adjustment such as flatness and orientation on the stage 107 although the mechanism of the posture adjustment is omitted. Then, the wafer 1 is forwarded to the first reactive chamber 101 by means of the transfer arm 108.

After completion of an etching treatment in the reactive chamber 101, the wafer 1 is returned to the stage 107 by the transfer arm 109. After the gate shutter 112 is opened, the wafer is forwarded to the stage 207 through the lateral-feeding belts 105, 205. The gate shutter 112 is then closed, and the transfer arm 208 transfers the wafer 101 to the second reactive chamber 201, where the after treatment is carried out. After the treatment is finished, the wafer 1 is returned to the stage 207 by the transfer arm 209. Pressure in the load lock chamber 203 is reduced to the same extent of the buffer room 213. The gate shutter 211 is opened and the wafer 1 is forwarded to the load lock chamber 203 through the lateral-feeding belt 205 and the wafer transferring belt 206 to be put on the cassette 3.

The operations of the etching and the after treatment for a second wafer 1 may be started before the above-mentioned operations for the first wafer 1 are finished.

As described above, the conventional reactive ion etching apparatus is advantageous in that standardization of the apparatus is possible because the same mechanism can be applied to the etching apparatus and the after treatment apparatus, and these apparatuses can be used as a single unit by connecting them in series. However, when the etching apparatus and the after treatment apparatus have to be connected in series, there arise problems that the whole unit becomes expensive, occupies much space and increases the number of operations such as opening of the gate shutter 112.

SUMMARY OF THE INVENTION

It is an object of the present invention to provide a small-sized reactive ion etching apparatus permitting continuous operations of etching and post-treating.

The foregoing and the other objects of the present invention have been attained by providing a reactive ion etching apparatus comprising a buffer room which contains a first reactive chamber, a second reactive chamber placed adjoining the first reactive chamber, a first stage member disposed opposing to the first reactive chamber, a second stage member disposed opposing to the second reactive chamber, a first transfer arm for transferring the wafer from the first stage member to the first reactive chamber, a second transfer arm for transferring the wafer among the first and second reactive chambers and the first and second stage members, and a third transfer arm for transferring the wafer from the second reactive chamber to the second stage member.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF PREFERRED EMBODIMENTS

Figure 1:
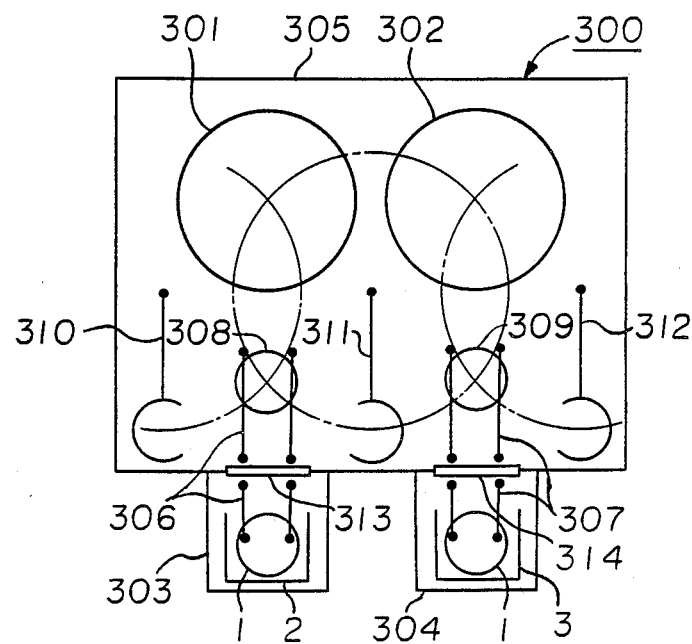
FIG. 1 is a diagram showing an embodiment of the reactive ion etching apparatus according to the present invention.
Figure 2:
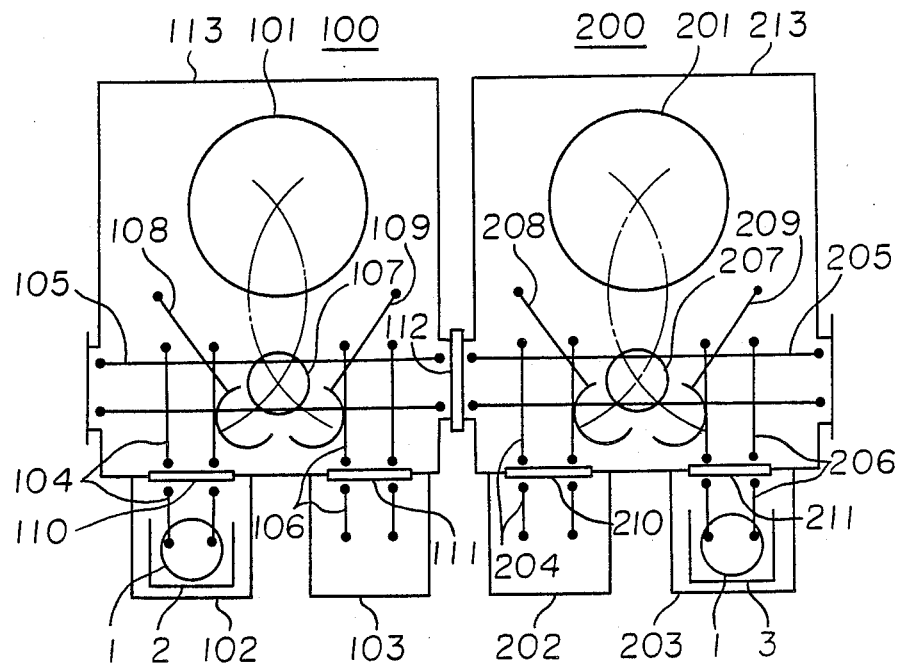
FIG. 2 is a diagram showing a conventional reactive ion etching apparatus.

Referring to the drawings, wherein like reference numerals designate identical or corresponding parts in the FIGS., and more particularly to FIG. 1 thereof, there is shown a diagram of a typical example of the reactive ion etching apparatus of the present invention. In FIG. 1, an etching apparatus 300 comprises a rectangular-shaped buffer room 305 and a first load lock chamber 303 for transferring a wafer 1 and a second load lock chamber 304 for drawing out the wafer 1. The buffer room 305 includes a first reactive chamber 301 for etching the wafer, a second reactive chamber 302 for after treatment of the wafer, a first stage 308 in which a mechanism for posture adjustment such as orientation and flatness of the wafer 1 is installed, a second stage 309 used for preparation of drawing out of the wafer, a first wafer transfer arm 310 for transferring the wafer 1 from the first stage 308 to the first reactive chamber 301, a second transfer arm 311 for transferring the wafer 1 from the first reactive chamber 301 to the second reactive chamber 302 and a third transfer arm 312 for transferring the wafer 1 from the second reactive chamber 302 to the second stage 309. A wafer transferring belt 306 and a wafer drawing-out belt 307 are respectively extend from the buffer room 305 to the first and second load lock chambers 303, 304. A first gate shutter 313 is provided at the boundary between the buffer room 305 and the first load lock chamber 303. A second gate shutter 314 is provided at the boundary between the buffer room 305 and the second load lock chamber 304. In more detail, the arrangement of the structural elements is such that the first and second reactive chambers 301, 302 and the first and second stages 308, 309 are respectively placed at each corner of a square configuration in the rectangular buffer room 305. The pivotal point of the second transfer arm 311 is at the center of the square arrangement of the reactive chambers 301, 302 and the stages 308, 309. The second transfer arm 311 is turnable 360° around the pivotal center. The belts 306, 307 respectively extend to the first and second stages 308, 309. The first transfer arm 310 is pivotally supported at the left side (in FIG. 1) in the buffer room and the third transfer arm 312 is pivotally supported at the right side (in FIG. 1) in the buffer room 305 so that they are swingable over each center of the first reactive chamber 301, the stage 308, the second reactive chamber 302 and the second stage 309. The three arms may be moved simultaneously by moving the first transfer arm and the third transfer arm in one of two directions, clockwise or counterclockwise, while moving the second transfer arm in the other of the two directions.

The operation of the reactive ion etching apparatus of the present invention will be described.

First, the first load lock chamber 303 is evacuated to bring the pressure of the chamber to the same as that of the buffer room 305. Then, the first gate shutter 313 is opened and a piece of wafer 1 which is carried by the cassette 2 is transferred to the first stage 308 by means of the transferring belt 306. The wafer 1 on the stage 308 is brought to the first reactive chamber 301 by the first transfer arm 310 to conduct an etching treatment. After the etching treatment is finished, the wafer 1 is moved from the first reactive chamber 301 to the second reactive chamber 302 by the second transfer arm 311 to conduct an after treatment.

After the after treatment is finished, the wafer is transferred from the second reactive chamber 302 to the second stage 309 by the third transfer arm 312. During or before the after treatment, the second load lock chamber 304 is evacuated to the same extent of the buffer room 305 and then, the second gate shutter 314 is opened. Then, the wafer 1 is put on the cassette 3 through the transferring belt 307.

In the embodiment of the ion etching apparatus of the present invention, a plurality of wafers 1 can be successively treated in such a manner that a second wafer 1 is introduced in the first reactive chamber 301 at the time when the first wafer 1 is transferred from the first reactive chamber 301 to the second reactive chamber 302.

When it is unnecessary to carry out the after treatment, i.e. the wafer 1 is drawn out after it is subjected to only etching treatment in the first reactive chamber 301, the wafer 1 can be transferred from the first reactive chamber 301 to second stage 309 by the second transfer arm 311.

Further, when it is necessary for the wafer 1 to be subject to a treatment in the reactive chamber 302, the wafer is transferred the first stage 308 to the second reactive chamber the second transfer arm 311.

The present invention is applicable to another apparatus such as CVD which are capable of continuously carrying out of treatment by using a piece-by-piece system, the reactive ion etching apparatus as described above.

In the above-mentioned, description had been made as to an example in reactive chambers are included in a single room. The present invention is, however, to an ion etching apparatus having three or chambers.

In the above-mentioned belts are used to transfer the wafers between the load lock chambers and the first and second stages. , another expedient may be used.

Thus, the reactive ion apparatus according to the present invention improve efficiency of treating the wafer and practically reduces the number of structural elements The present invention is advantageous in reducing manufacturing cost of the apparatus and reduces a space for installation of the apparatus.

Obviously, numerous modifications and variation of the present invention are possible in light of the above teaching. It is therefore to be understood that within the scope of the appended claims, the invention may be practiced otherwise than as specifically described herein.

What is claimed is:

1. A reaction ion etching apparatus comprising a buffer room which contains:
   a first reactive chamber,
   a second reactive chamber placed adjoining said first reactive chamber in a first direction,
   a first stage member disposed adjoining said first reactive chamber in a second direction perpendicular to said first direction,
   a second stage member disposed adjoining said second reactive chamber in said second direction,
   the centers of said first and second reactive chambers and said first and second stage members are respectively at corners of a square;
   a first transfer arm positioned and arranged for transferring a wafer from said first stage member to said first reactive chamber,
   a second transfer arm positioned and arranged for transferring said wafer among said first and second reactive chambers and said first and second stage members, said second transfer arm having a pivot point at the center of said square so as to be turnable through 360°, and
   a third transfer arm positioned and arranged for transferring said wafer from said second reactive chamber to said second stage member;
   said first, second and third transfer arm each positioned and arranged for transferring wafers along a path defined by the length of their respective arms wherein all three arms may be moved simultaneously by moving said first transfer arm and said third transfer arm in one of two directions, clockwise or counterclockwise, while moving said second transfer arm in the other of said two directions.

2. The reactive ion etching apparatus according to claim 1, wherein said first reactive chamber is configured so as to etch said wafer and said second reactive chamber is configured so as to conduct an after treatment of said wafer.

3. The reactive ion etching apparatus according to claim 1, wherein said buffer room is rectangular.

4. The reactive ion etching apparatus according to claim 3, wherein said buffer room is provided with two load lock chambers which are located near said first and second stage members.

5. The reactive ion etching apparatus according to claim 4, wherein a shutter is provided between each of said load lock chambers and said buffer room.

* * * * *